(12) United States Patent
Mandelman et al.

(10) Patent No.: US 6,777,737 B2
(45) Date of Patent: Aug. 17, 2004

(54) VERTICAL DRAM PUNCHTHROUGH STOP SELF-ALIGNED TO STORAGE TRENCH

(75) Inventors: Jack A. Mandelman, Stormville, NY (US); Dureseti Chidambarrao, Weston, CT (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/016,605

(22) Filed: Oct. 30, 2001

(65) Prior Publication Data

US 2003/0082876 A1 May 1, 2003

(51) Int. Cl.[7] .......................................... H01L 27/108
(52) U.S. Cl. ...................................... 257/305; 257/301
(58) Field of Search ................................ 257/301, 302, 257/304, 305

(56) References Cited

U.S. PATENT DOCUMENTS

| | | | |
|---|---|---|---|
| 5,731,609 A | * | 3/1998 | Hamamoto et al. ......... 257/302 |
| 6,025,224 A | | 2/2000 | Gall et al. |
| 6,051,468 A | | 4/2000 | Hshieh |

* cited by examiner

Primary Examiner—Kamand Cuneo
Assistant Examiner—Scott B. Geyer
(74) Attorney, Agent, or Firm—Scully, Scott, Murphy & Presser; Joseph P. Abate, Esq.

(57) ABSTRACT

A semiconductor memory structure having a feature size of less than about 90 nm which exhibits little or no dynamic charge loss and little or no trap assisted junction leakage is provided. Specifically, the semiconductor structure includes at least one back-to-back pair of trench storage memory cells present in a Si-containing substrate. Each memory cell includes a vertical transistor overlaying a trench capacitor. Strap outdiffusions are present on each vertical sidewall of the trench storage memory cells so as to interconnect the vertical transistor and the trench capacitor of each memory cell to the Si-containing substrate. A punchthrough stop doping pocket is located between each back-to-back pair of trench storage memory cells and it is centered between the strap outdiffusions of adjacent storage trenches, and self-aligned to the adjacent storage trenches.

9 Claims, 22 Drawing Sheets

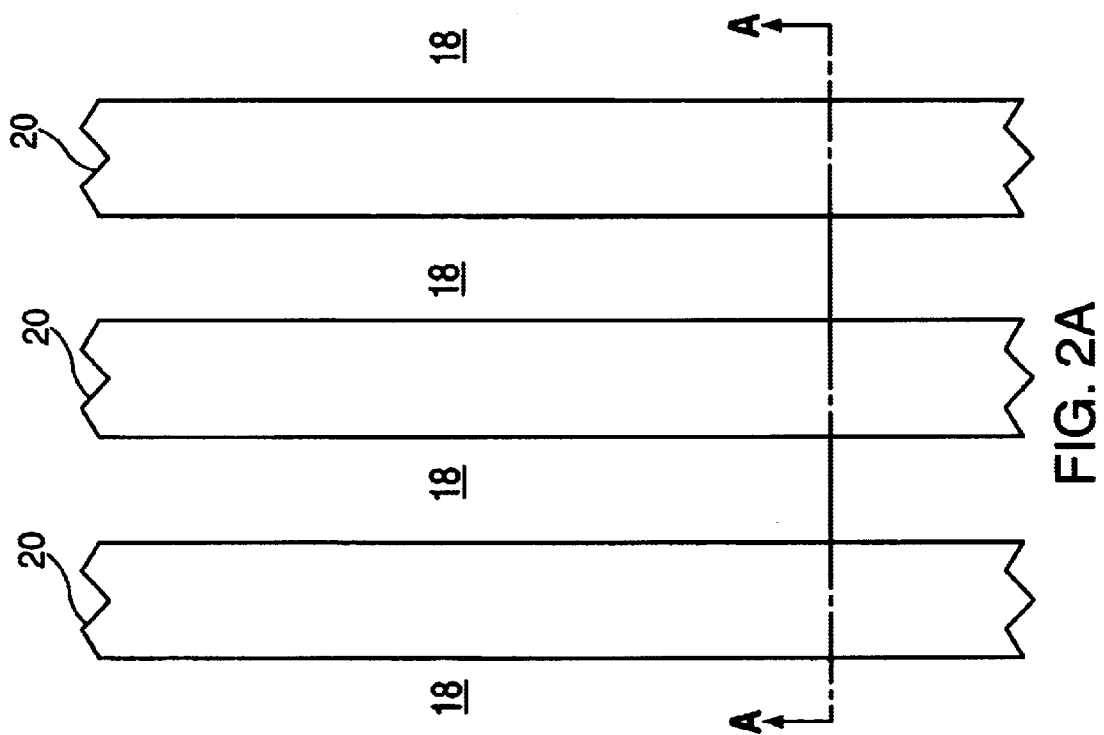

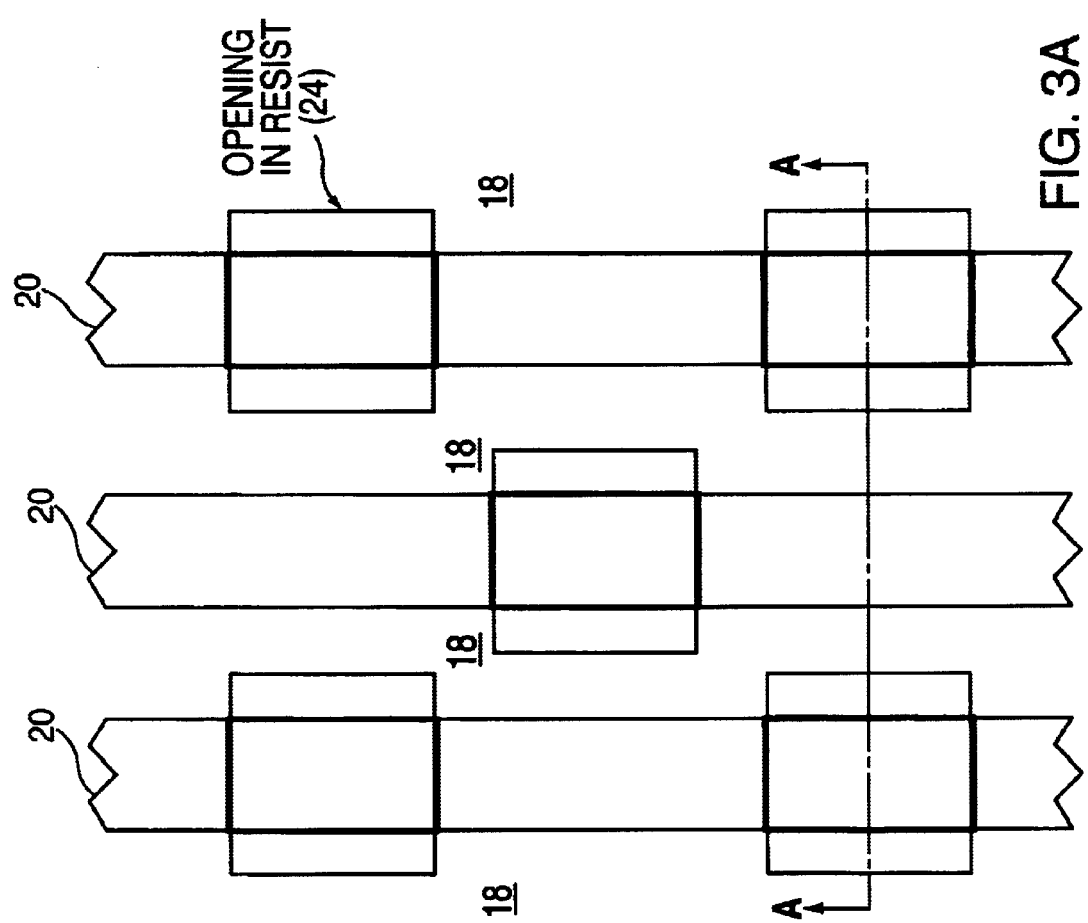

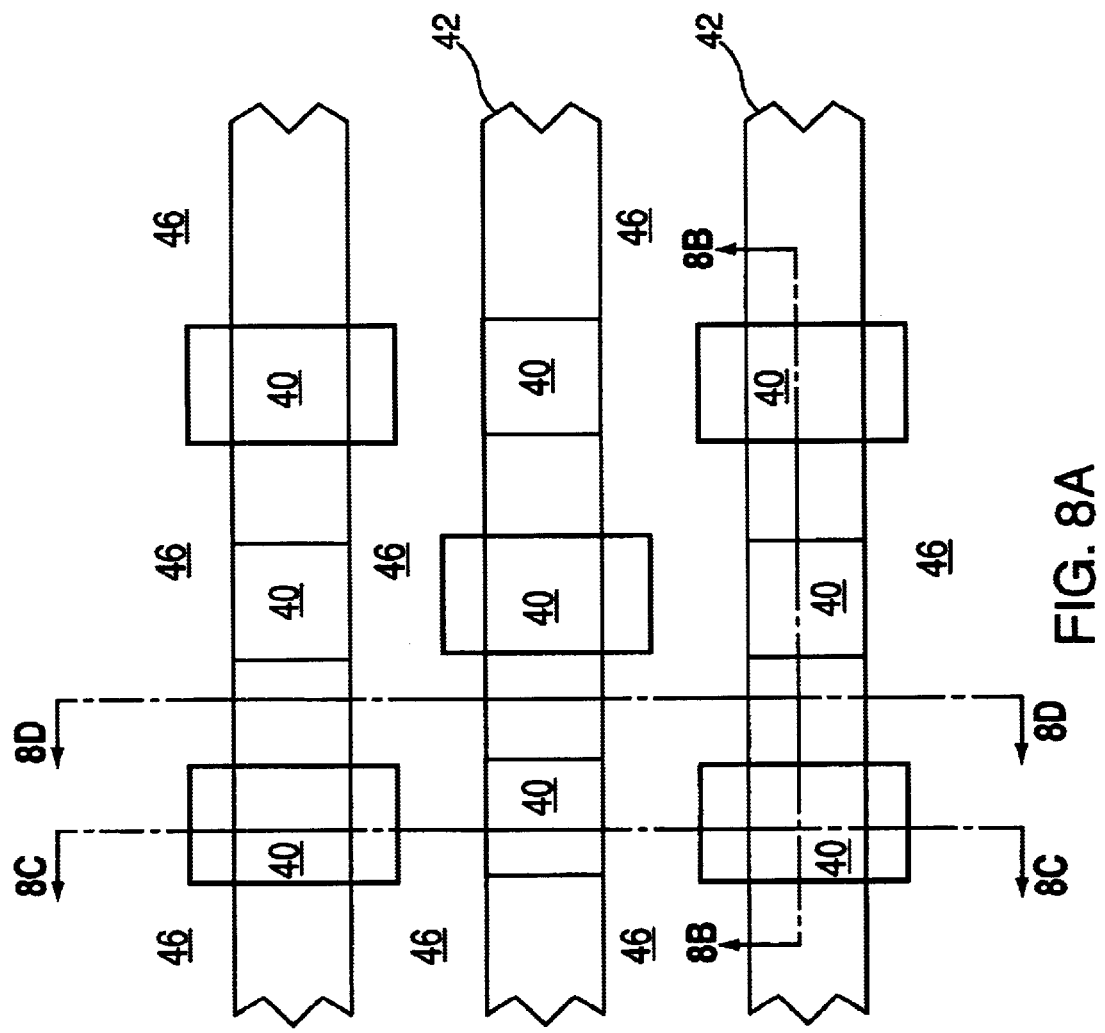

VERTICAL DRAM PUNCHTHROUGH STOP SELF-ALIGNED TO STORAGE TRENCH

DESCRIPTION

1. Field of the Invention

The present invention relates to a semiconductor memory device, and more particularly to a back-to-back, i.e., adjacent, pair of vertical metal oxide semiconductor field effect transistor (MOSFET) trench storage dynamic random access memory (DRAM) cells having a punchthrough stop doping pocket which is centered between two opposing strap outdiffusions. The present invention also provides a method of fabricating the inventive vertical MOSFET trench storage DRAM cells.

2. Background of the Invention

As the minimum feature size, F, of vertical DRAM arrays is scaled; cell-to-cell interaction becomes an increasing concern. With scaling of a typical prior art 90 m $8F^2$ cell to smaller dimensions, loss of a stored "1" may occur due to cycling of the data stored on an adjacent cell. The cycling wordline and storage node of the adjacent cell drives a non-conservative charge pumping mechanism which is ultimately responsible for loss of a stored "1".

This dynamic charge loss mechanism can be minimized to some extent by increasing the doping concentration of the array P-well, especially at the depth of the buried-strap outdiffusion. However, to prevent degradation of the retention time tail due to trap assisted junction leakage, the doping concentration adjacent to the strap outdiffusion must be limited.

In view of the above-mentioned drawbacks with prior art vertical MOSFET storage trench DRAM structures, there is a continued need for providing a scaled vertical MOSFET storage trench DRAM structure that has a minimum feature size F of less than about 90 nm, little or no dynamic charge loss, as well as little or no trap assisted junction leakage.

SUMMARY OF THE INVENTION

One object of the present invention is to provide a semiconductor memory structure having a minimum feature size F of less than about 90 nm.

Another object of the present invention is to provide a scaled semiconductor memory structure wherein the dynamic charge loss mechanism is minimized such that little or no dynamic charge loss is observed.

A further object of the present invention is to provide a scaled memory structure which exhibits little or no trap assisted junction leakage therefore preventing the degradation of the retention time tail.

An even further object of the present invention is to provide a scaled memory structure having punchthrough stop doping pockets that are self-aligned to the storage trenches of the vertical MOSFET DRAM structure.

A still further object of the present invention is to provide a semiconductor memory structure wherein the punchthrough stop doping pockets of the structure share a common mask with the storage trenches of the vertical MOSFET DRAM structure.

These and other objects and advantages are achieved in the present invention by providing a semiconductor memory structure that includes a back-to-back, i.e., adjacent, pair of vertical MOSFET trench storage DRAM cells having a punchthrough stop pocket region of elevated P- or N-well doping which is centered between two opposed strap outdiffusions. In the inventive semiconductor memory structure, the punchthrough stop doping pocket is formed at a location relative to adjacent storage trenches that is independent of alignment tolerances.

Specifically, the inventive semiconductor memory structure comprises:

at least one adjacent pair of trench storage memory cells present in a Si-containing substrate, each memory cell including a vertical transistor overlaying a trench capacitor;

strap outdiffusions present on each vertical sidewall of the trench storage memory cells, wherein said strap outdiffusions interconnect said vertical transistor and said trench capacitor of each memory cell to said Si-containing substrate; and a punchthrough stop doping pocket located between each adjacent pair of trench storage memory cells, said punchthrough stop doping pocket is centered between said strap outdiffusions.

In embodiments wherein more than one back-to-back pair of trench storage memory cells, i.e., a plurality of adjacently paired trench storage memory cells, are employed, a memory array is formed which includes punchthrough stop doping pockets whose location relative to adjacent storage trenches is independent of alignment tolerance. That is, a memory array is formed wherein the punchthrough doping pockets are located at substantially the same location, including distance from the top surface of the Si-containing substrate as well as distance from storage trenches, within the Si-containing substrate.

Another aspect of the present invention relates to a method of providing the above-mentioned semiconductor memory structure. Specifically, the inventive method comprises the steps of:

(a) forming at least one adjacent pair of trench storage memory cells present in a Si-containing substrate, each memory cell including a vertical transistor overlaying a trench capacitor and strap outdiffusions present on each vertical sidewall of the trench storage memory cells, wherein said strap outdiffusions interconnect said vertical transistor and said trench capacitor of each memory cell to said Si-containing substrate; and (b) forming a punchthrough stop doping pocket between each adjacent pair of trench storage memory cells, said punchthrough stop doping pocket is centered between said strap outdiffusions and is self-aligned to said trench capacitor.

DETAILED DESCRIPTION OF THE INVENTION

Figure 1:
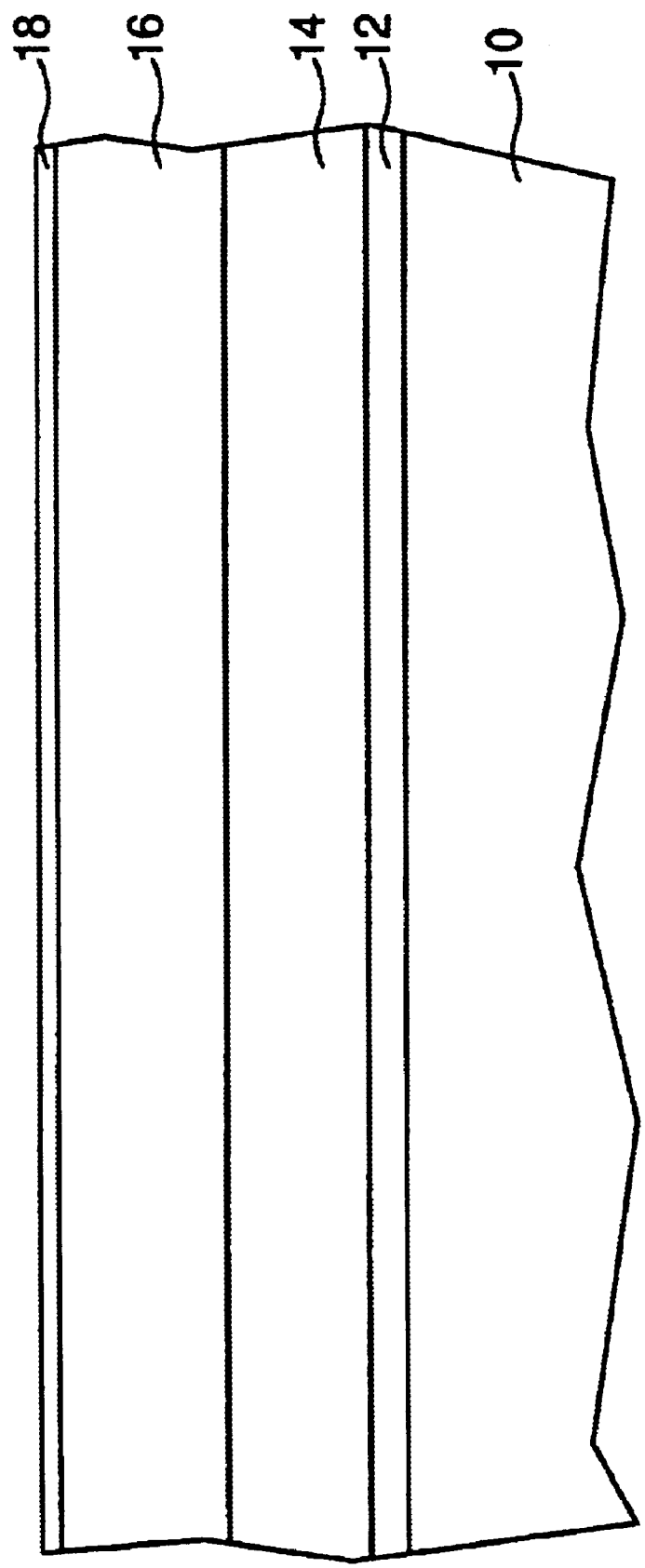
FIGS. 1–14 are pictorial representations (through various views and cuts) showing the inventive semiconductor memory structure through various processing steps of the present invention.

The present invention, which provides a semiconductor memory structure that includes at least one back-to-back pair of vertical MOSFET trench storage DRAM cells having a punchthrough stop pocket region of elevated P- or N-well doping which is centered between two opposed strap outdiffusions as well as a method of fabricating the same, will now be described in more detail by referring to the drawings that accompany the present application.

Reference is first made to the initial structure shown in FIG. 1 which is employed in the present invention in fabricating the inventive semiconductor memory structure. Specifically, the initial structure shown in FIG. 1 comprises Si-containing semiconductor substrate 10, pad oxide layer 12 formed atop a surface of Si-containing semiconductor substrate 10, pad nitride layer 14 formed atop a surface of pad oxide layer 12, oxide hardmask 16 formed atop a surface of pad nitride layer 14, and polish stop layer 18 formed atop a surface of the oxide hardmask.

The initial structure shown in FIG. 1 is comprised of conventional materials well known to those skilled in the art and conventional processes also well known to those skilled in the art are employed in forming the same. Specifically, pad oxide layer 12 is formed on a surface of Si-containing semiconductor substrate 10 by employing a conventional deposition process such as chemical vapor deposition (CVD), plasma-assisted CVD, sputtering, chemical solution deposition and other like deposition processes. Alternatively, and more preferably, a thermal oxidation process is employed in the present invention in forming pad oxide layer 12. Notwithstanding the method used in forming the pad oxide layer, pad oxide layer 12 has a thickness of from about 1 to about 10 nm, with a thickness of from about 3 to about 7 nm being more highly preferred.

Next, pad nitride layer 14 is formed atop a surface of pad oxide layer 12 utilizing a conventional deposition process such as CVD (including low-pressure CVD), plasma-assisted CVD, sputtering, and chemical solution deposition. The pad nitride layer formed at this point of the present invention is typically thicker than pad oxide layer 12 previously formed on the Si-containing substrate. Typically, pad nitride layer 14 has a thickness of from about 100 to about 1000 nm, with a thickness of from about 400 to about 700 nm being more highly preferred.

Following the formation of pad nitride layer 14, oxide hardmask 16 is formed atop the pad nitride layer utilizing a conventional deposition process including, but not limited to: CVD, plasma-assisted CVD, sputtering, and chemical solution deposition. Although any oxide may be employed, it is preferred in the present invention that oxide hardmask 16 be comprised of TEOS (tetraethylorthosilicate). It is noted that oxide hardmask 16 is employed in the present invention as a mask for subsequent etching of trenches into the Si-containing substrate. The thickness of the oxide hardmask is not critical to the present invention. Typically, however, oxide hardmask 16 has a thickness of from about 500 to about 2000 nm, with a thickness of from about 800 to about 1500 nm being more highly preferred.

Next, polish stop layer 18 is formed atop the surface of oxide hardmask 16 utilizing a conventional deposition process including, but not limited to: CVD, plasma-assisted CVD, sputtering, chemical solution deposition and other like deposition processes. The polish stop layer employed in the present invention is composed of silicon nitride, polysilicon or combinations including multilayers thereof. It is noted that polish stop 18 is subsequently used in the present invention to transfer a storage trench image through oxide hardmask 16 and pad layers 14 and 12, respectively.

Figure 2B:
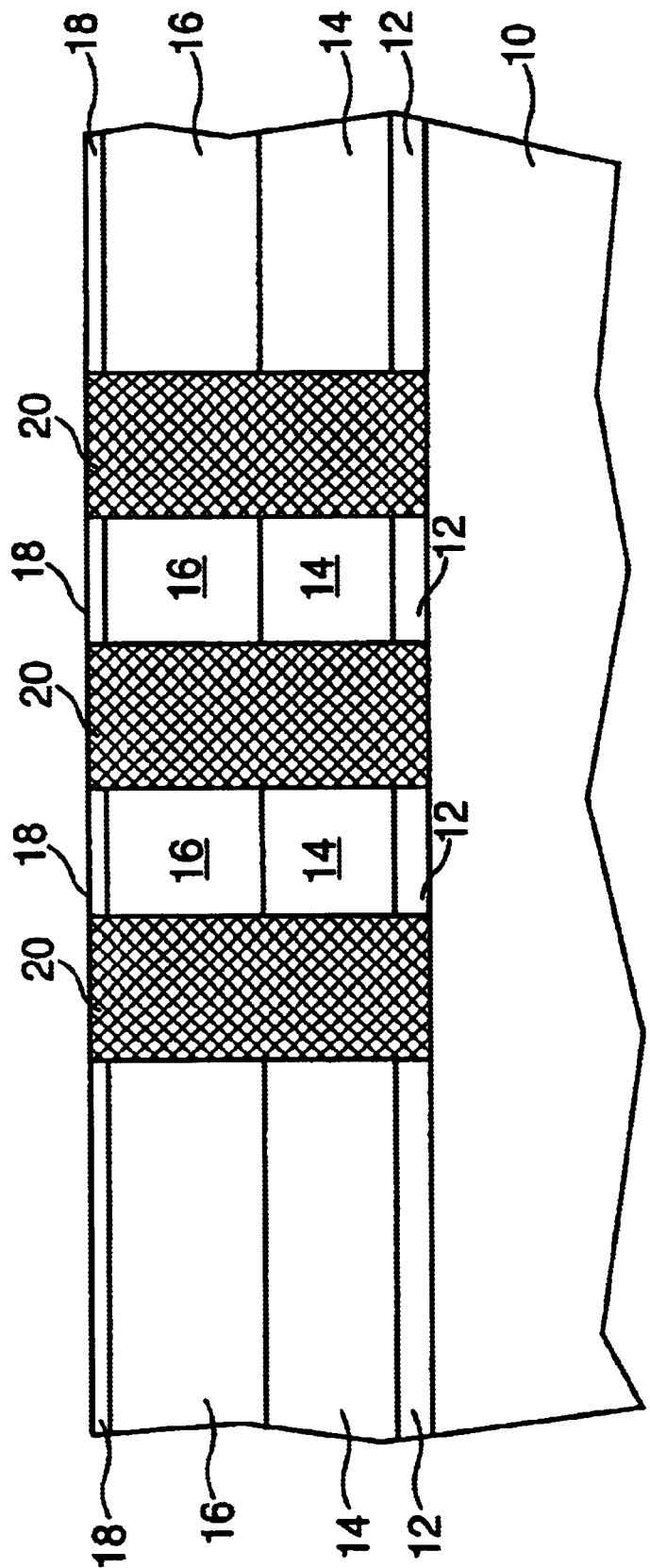

FIGS. 2A (top view) and 2B (cross-sectional view) show the structure that is formed after a pattern of parallel troughs have been defined in layers 12, 14, 16 and 18 and filled with CVD or high-density plasma (HDP) oxide. The oxide filled troughs, which are employed as a placeholder material in the present invention, are labeled as reference numeral 20 in FIGS. 2A–2B. The structure shown in FIGS. 2A–2B is formed by first applying a photoresist mask (not specifically shown in the drawings) atop polish stop layer 18; exposing the photoresist to a pattern of radiation; developing the pattern in the photoresist and transferring the pattern to layers 18, 16, 14 and 12 utilizing a conventional dry etching process such as reactive-ion etching (RIE), plasma-etching or ion beam etching. Note that the etching process stops atop Si-containing semiconductor substrate 10.

Following the etching process which forms troughs within layers 18, 16, 14 and 12, the photoresist is removed utilizing a conventional stripping process and an oxide (CVD or HDP) is deposited onto the structure (including on the top surface of polish stop layer 18 as well as within the previously etched troughs) utilizing a conventional deposition process. Following deposition of the CVD or HDP oxide, the CVD or HPD oxide is planarized to polish stop layer 18 utilizing a conventional planarization process, such as chemical-mechanical polishing (CMP) or grinding, providing the structure shown in FIGS. 2A–2B.

Figure 3B:
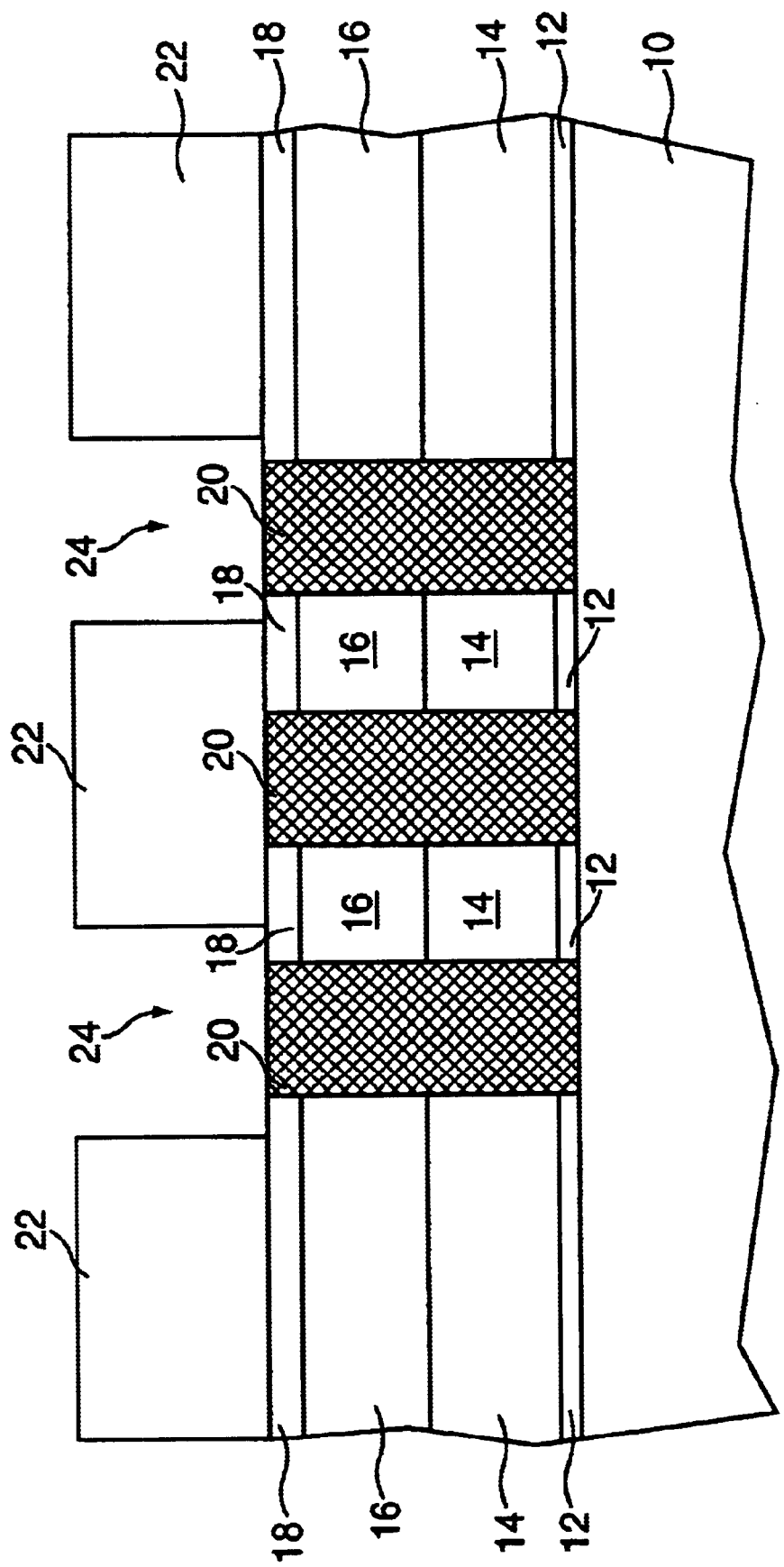

Following the formation of oxide filled troughs 20 in the structure, patterned photoresist 22 having openings 24 exposing alternating, i.e., every other, oxide filled trough 20 is formed on the structure shown in FIGS. 2A and 2B so as to provide the structure shown in FIGS. 3A (top view) and 3B (cross-sectional view). Specifically, patterned photoresist 22 is formed utilizing the above mentioned lithography steps. It is emphasized that openings 24 are formed in patterned photoresist 22 so as to expose alternating oxide filled troughs provided above and that the edge of the patterned photoresist extends beyond the edge of the exposed oxide filled troughs. The openings are employed in the present invention to define areas in which storage trenches will be formed into Si-containing substrate 10, while the protected oxide filled troughs between neighboring exposed oxide filled troughs, will be employed in the present invention as the area in which the punchthrough stop doping pocket will be subsequently formed.

Next, the exposed oxide in the filled troughs in layers above the surface of Si-containing substrate 10, i.e., layers 18, 16, 14 and 12, is removed utilizing an etching process such as RIE which is highly selective to photoresist 22 and polish stop layer 18. This etching step removes the CVD or HDP oxide from the exposed troughs above the surface of the Si-containing semiconductor substrate. Note that the remaining oxide regions, i.e., CVD oxide in the protected troughs as well as oxide layer 16, serve as a hardmask for etching of the trenches.

After removing patterned photoresist 22 from the structure via a conventional stripping process, standard trench processing is applied to (i) etch storage trenches into the Si-containing substrate; (ii) form storage capacitor n+buried-plate diffusion region 26 about a lower portion of each trench; (iii) form node dielectric 28 such as a composite nitride/oxide lining the interior sidewalls of the lower portion of each trench; (iv) form collar oxide region 30; and (v) fill each trench with N+ polysilicon 32 utilizing a conventional in-situ doping deposition process and planarizing the N+ doped polysilicon to the top surface of pad nitride layer 14 (the remaining oxide layer is removed during the planarization process). It is noted that steps (i)–(v) mentioned above are conventional processing steps that are well known in fabricating storage trench capacitors in vertical deep trench memory cells therefore no further detailed description concerning the same is provided herein.

The resultant structure that is formed after performing the trench processing steps described above is shown in FIG. 4.

Note that n+buried-plate diffusion region 26, node dielectric 28, and a portion of N+ polysilicon 32 form the capacitor portion of each memory cell.

Figure 4:
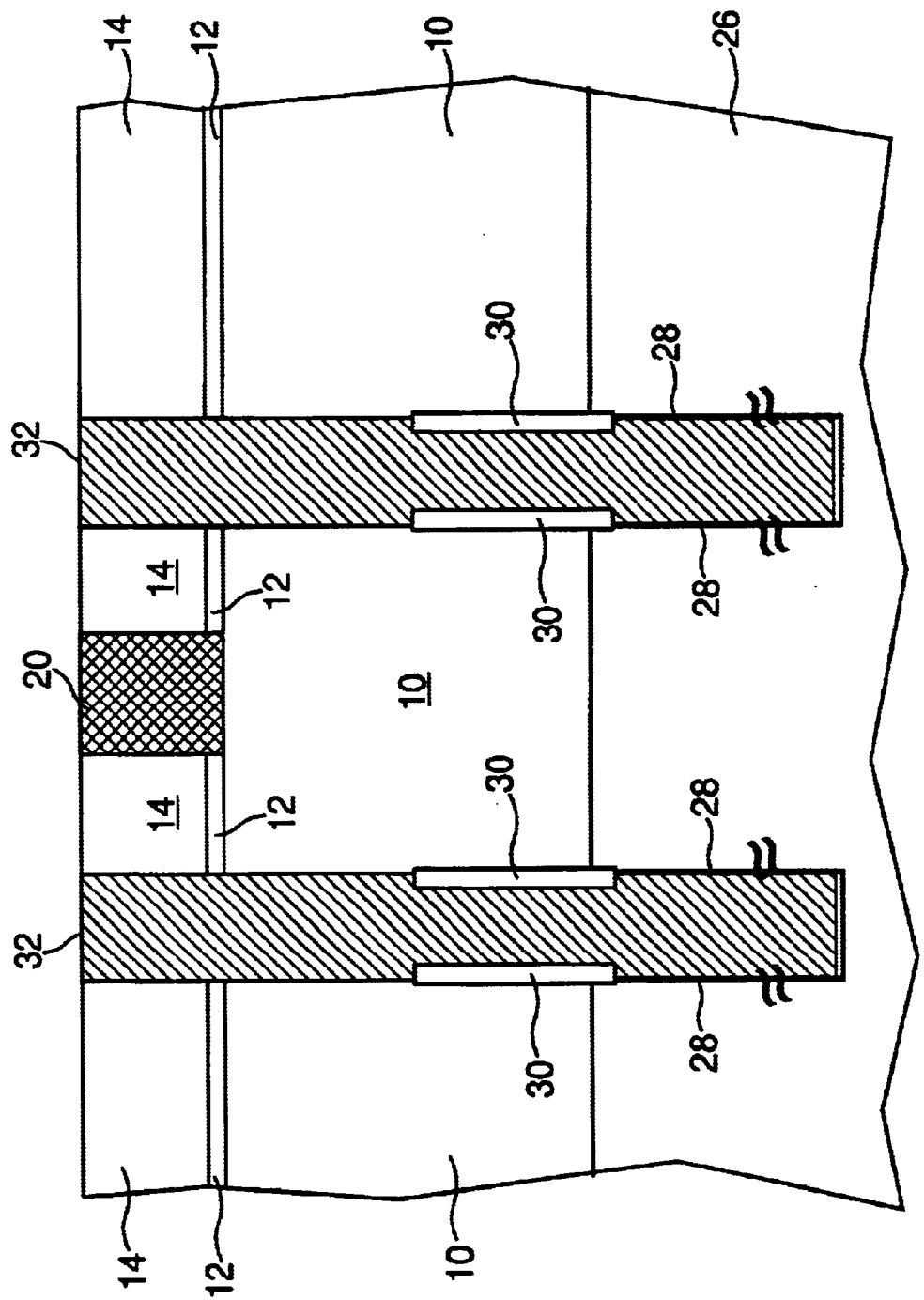

After filling the trenches with N+ polysilicon and planarization to the nitride pad layer, the structure shown in FIG. 4 is subjected to a recessing process in which a portion of the N+ polysilicon contained within each trench is removed to a predetermined depth required to define the channel length of the vertical MOSFET. The recessing process is carried out utilizing a conventional etching process that is highly selective to nitride and oxide.

A strap (not specifically labeled), and accompanying strap diffusions 34, interconnecting the N+ polysilicon capacitor electrode, i.e., remaining N+ polysilicon 32, to Si-containing semiconductor substrate 10, are formed in each trench using processing steps that are well known to those skilled in the art. Following the formation of the strap and strap outdiffusion regions, the remaining exposed oxide in the troughs that were previously protected is removed using a reactive-ion etching process that is selective to oxide and silicon.

Figure 5:
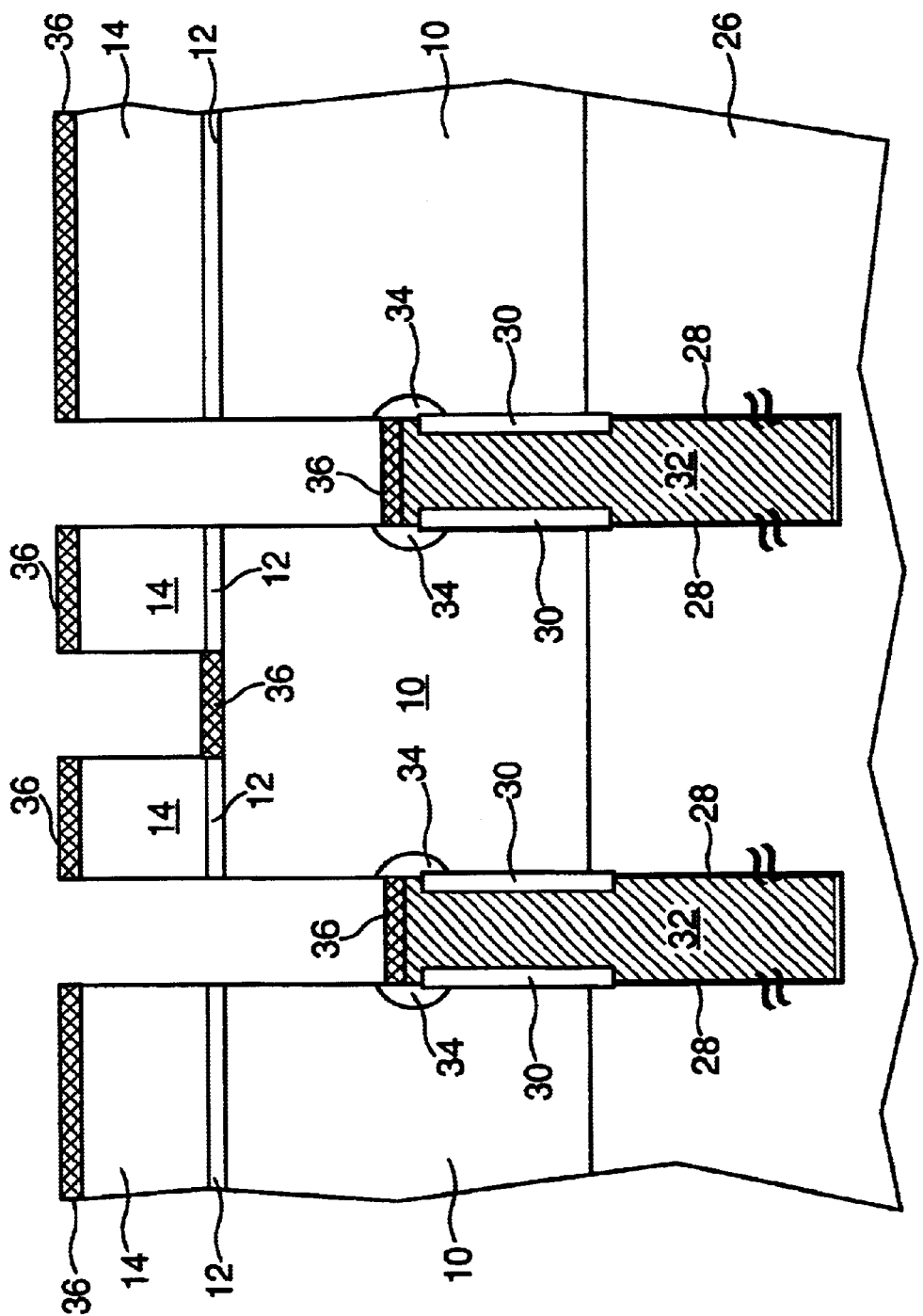

Trench top oxide (TTO) 36 is deposited on all horizontal surfaces present in the structure utilizing high-density plasma (HDP) oxide deposition and isotropic etching to remove residual TTO from vertical surfaces. This leaves a substantial TTO insulator thickness of from about 10 to about 50 nm, more preferably of from about 20 to about 40 nm, on the horizontal surfaces. The resultant structure including TTO oxide 36 that is formed after performing the above mentioned processing steps is shown in FIG. 5.

Figure 6:
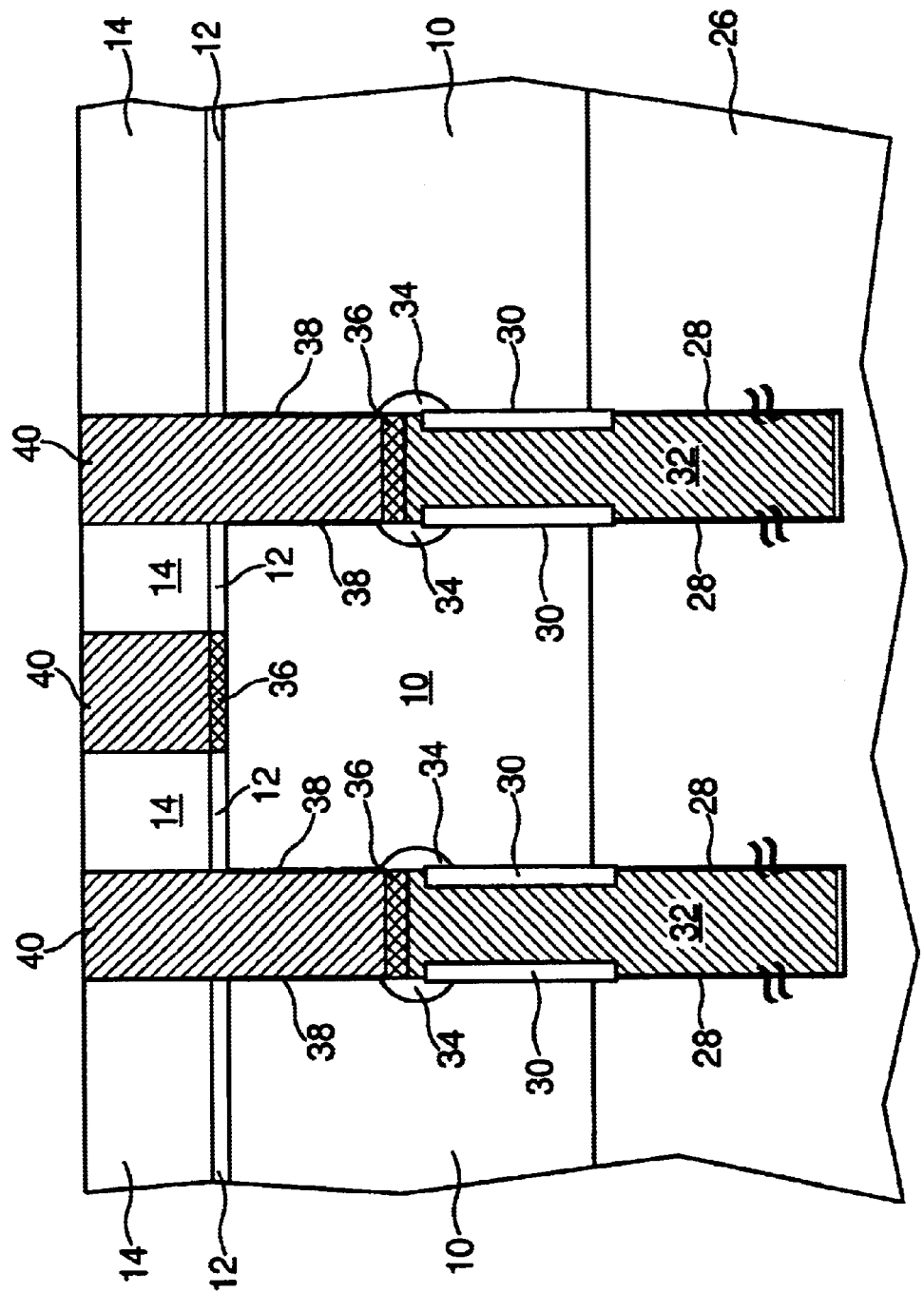

FIG. 6 illustrates the structure after conventional vertical array MOSFET processing steps are performed so as to form a vertical MOSFET atop TTO layer 36 in each storage trench. Specifically, the vertical MOSFET array processing begins with forming gate dielectric layer 38 on each exposed vertical sidewall within each trench. The gate dielectric layer, which may be comprised of an oxide, nitride, oxynitride or combinations including multilayers thereof, is formed utilizing a conventional deposition process, or alternatively a thermal oxidation, nitridation or oxynitridation process may be employed in forming gate dielectric layer 38. The thickness of the gate dielectric material formed at this point of the inventive process may vary depending on the composition and technique used in forming the same. Typically, however, gate dielectric layer 38 has a thickness of from about 3 to about 8 nm, with a thickness of from about 4 to about 7 nm being more highly preferred.

Next, heavily doped N+ polysilicon layer 40 having a dopant concentration on the order of about 1E20 cm$^{-3}$ or above is formed atop TTO layer 36 and thereafter the heavily doped N+ polysilicon layer and TTO oxide formed atop pad nitride layer 14 are removed via a conventional planarization process stopping on a top surface of nitride pad layer 14. Note that the remaining heavily doped N+ polysilicon within each trench is the gate conductor of the vertical transistor.

As illustrated in FIG. 6, the vertical transistor (including gate dielectric 38 and heavily doped N+ polysilicon 40) is formed atop the trench capacitor. The vertical transistor and trench capacitor are separated by TTO 36, yet both elements are interconnected to the Si-containing substrate by means of the strap outdiffusions which are present on exterior sidewalls of each trench.

Figure 7A:
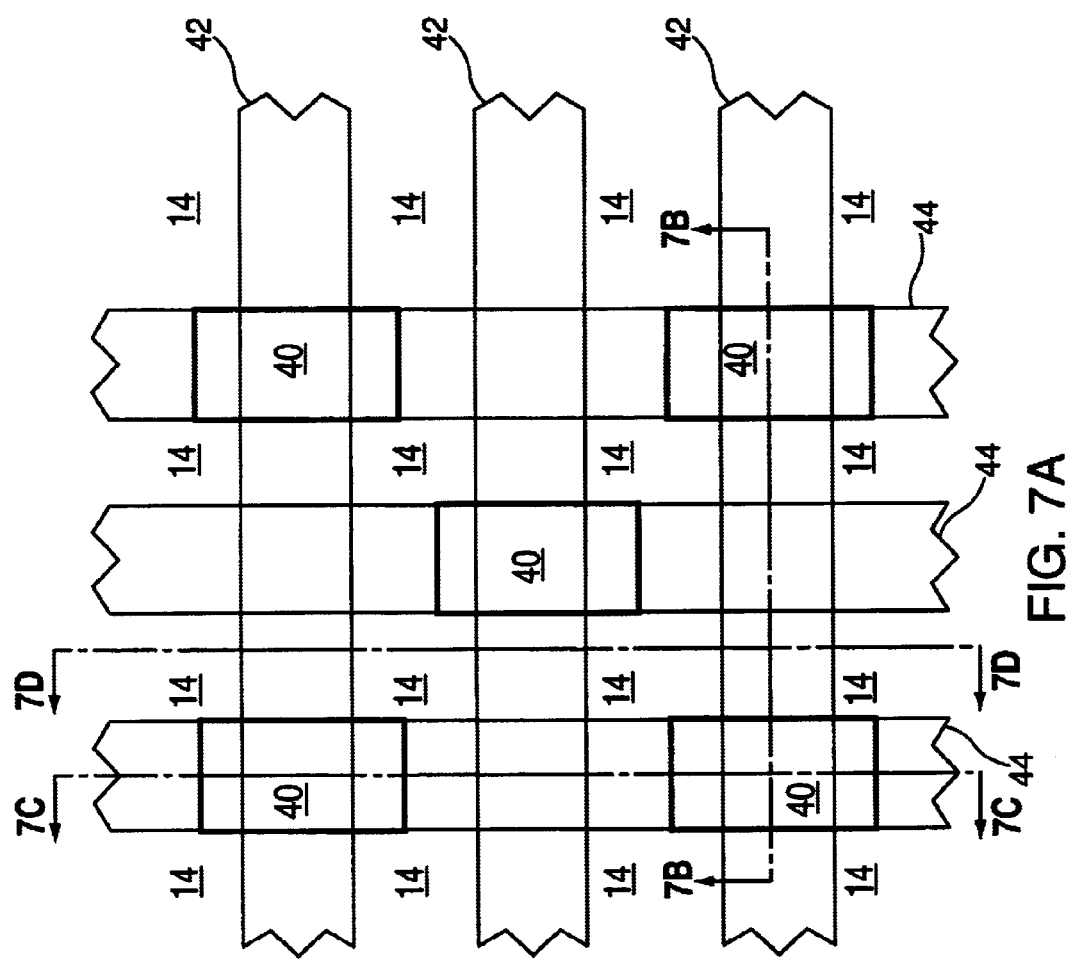
Figure 7B:
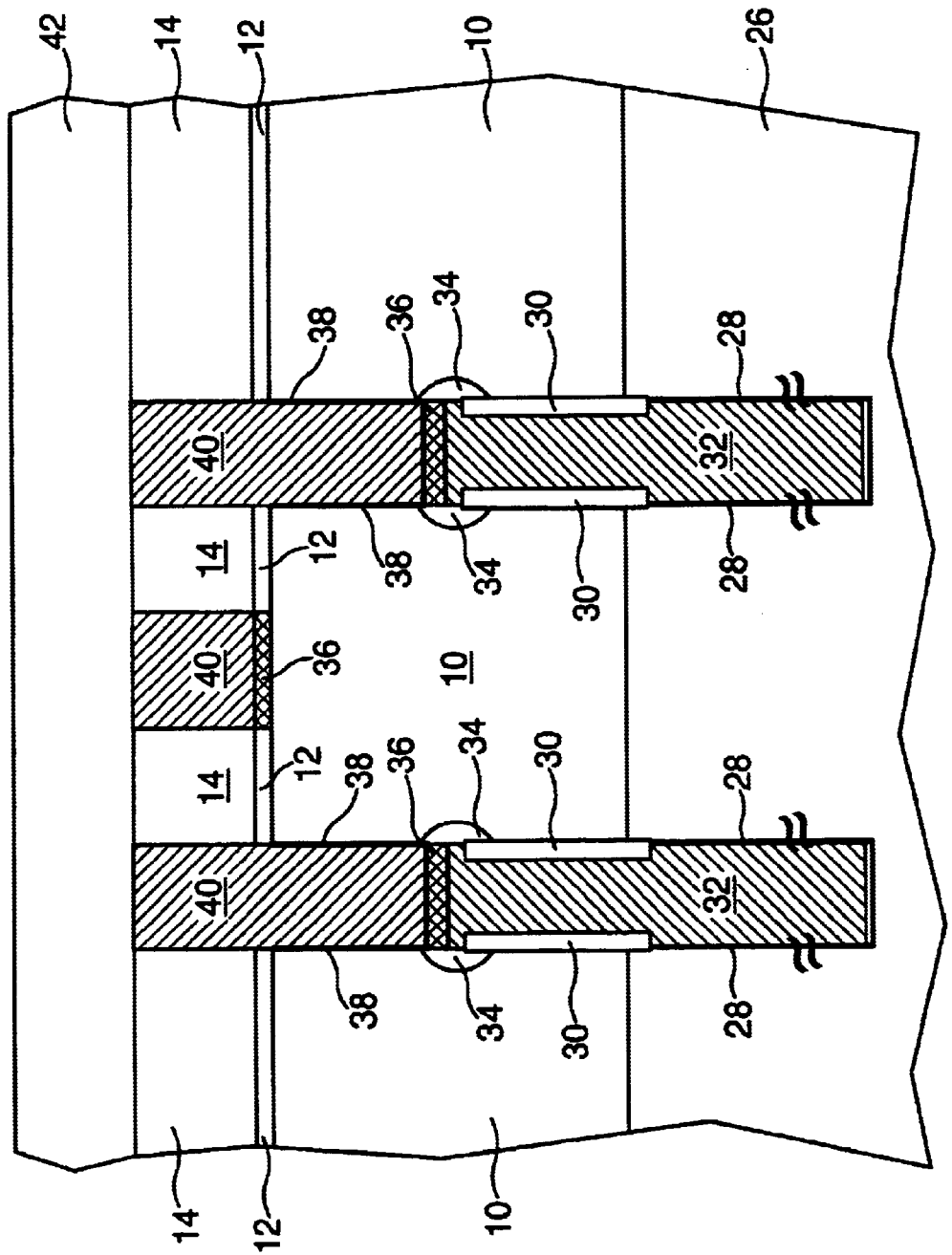
Figure 7C:
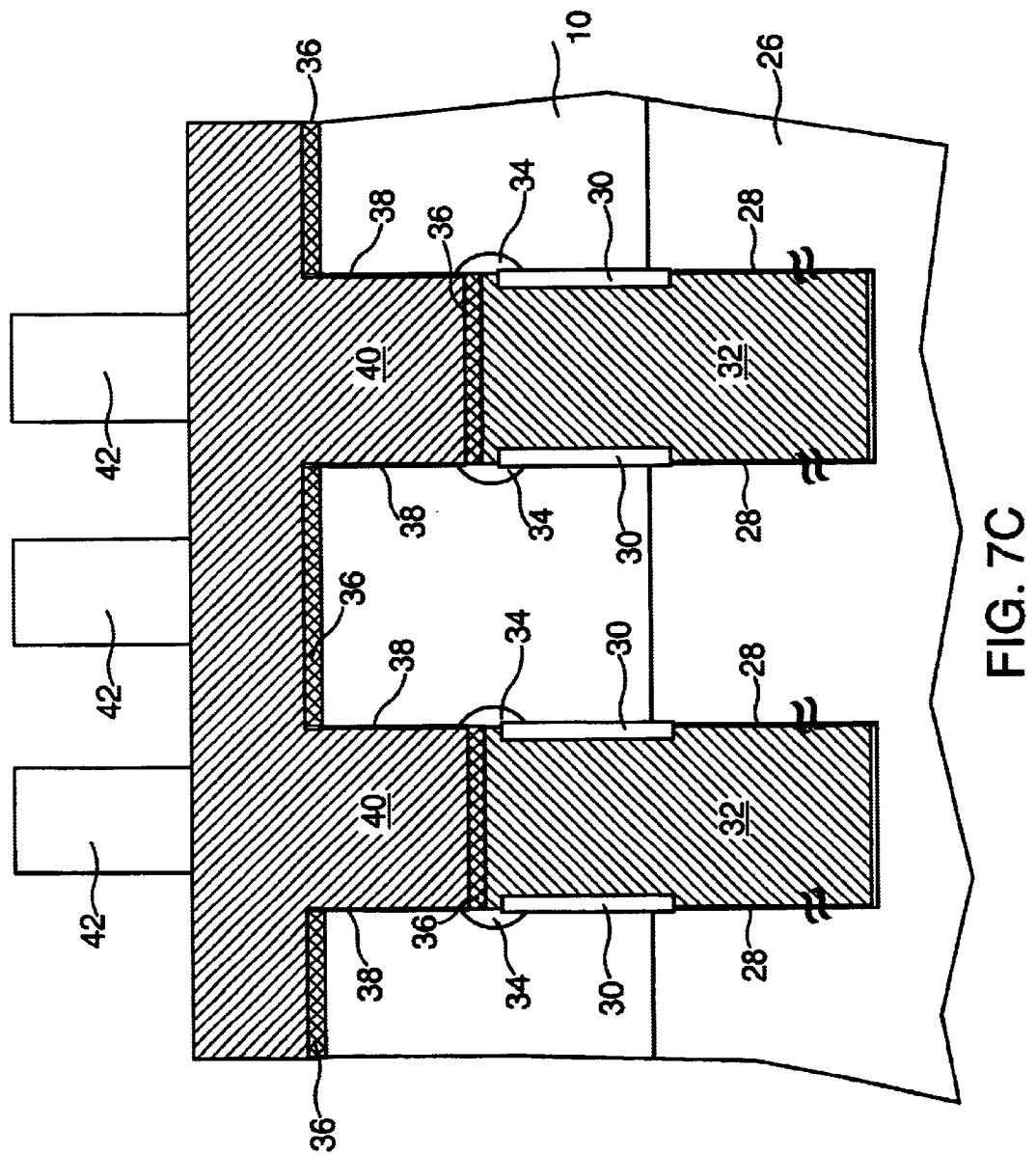
Figure 7D:
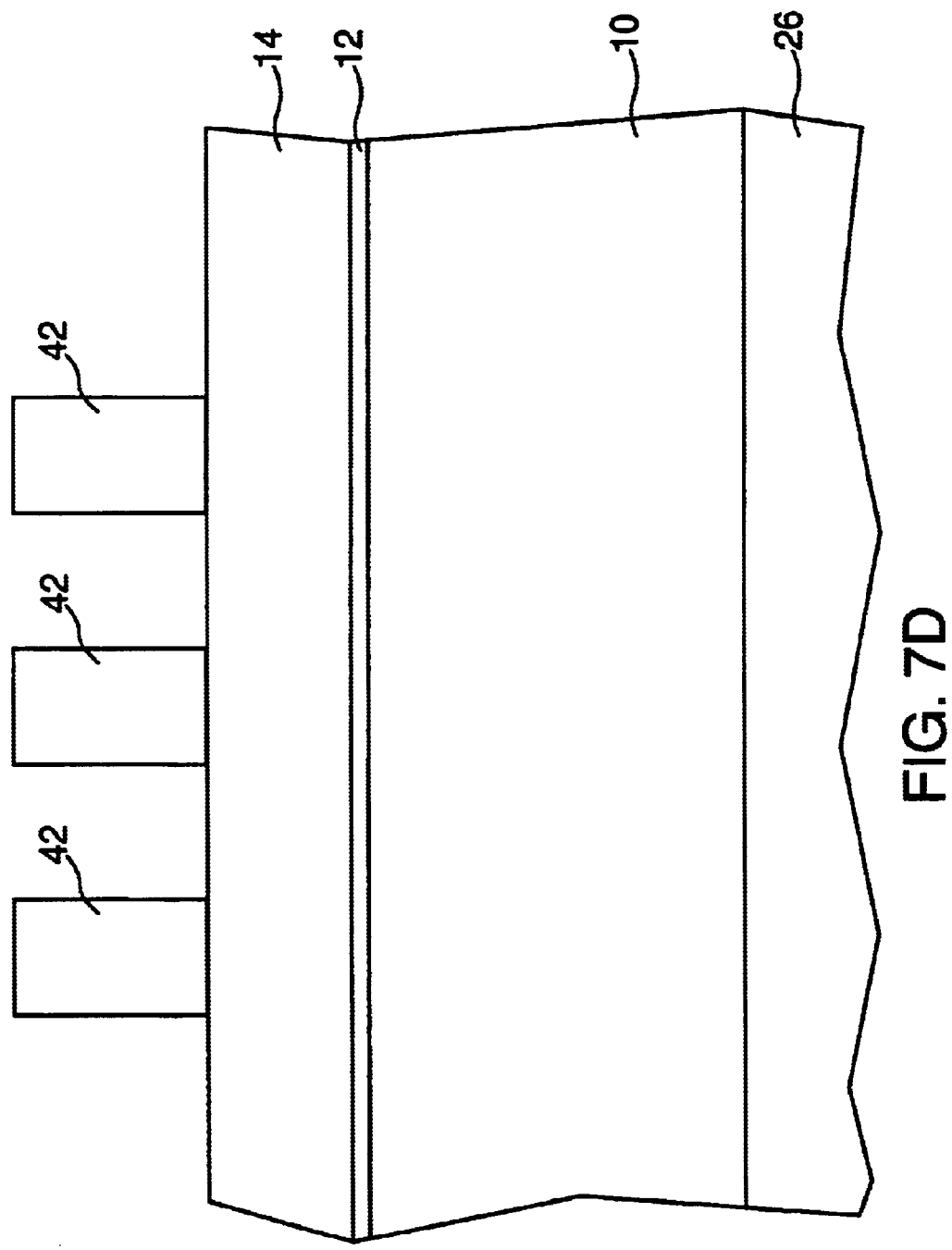

Active area resist stripes 42 are then formed orthogonal to the storage trenches so as to provide the structure shown in FIG. 7A (top view). Note that FIG. 7A includes various cuts including A—A which is a cross-sectional view showing a back-to-back pair of vertical MOSFET trench storage memory cells; B—B which is cross-sectional view through gate conductor polysilicon lines 44, and C—C which is a cross-sectional view between gate conductor polysilicon lines 44.

Figure 8B:
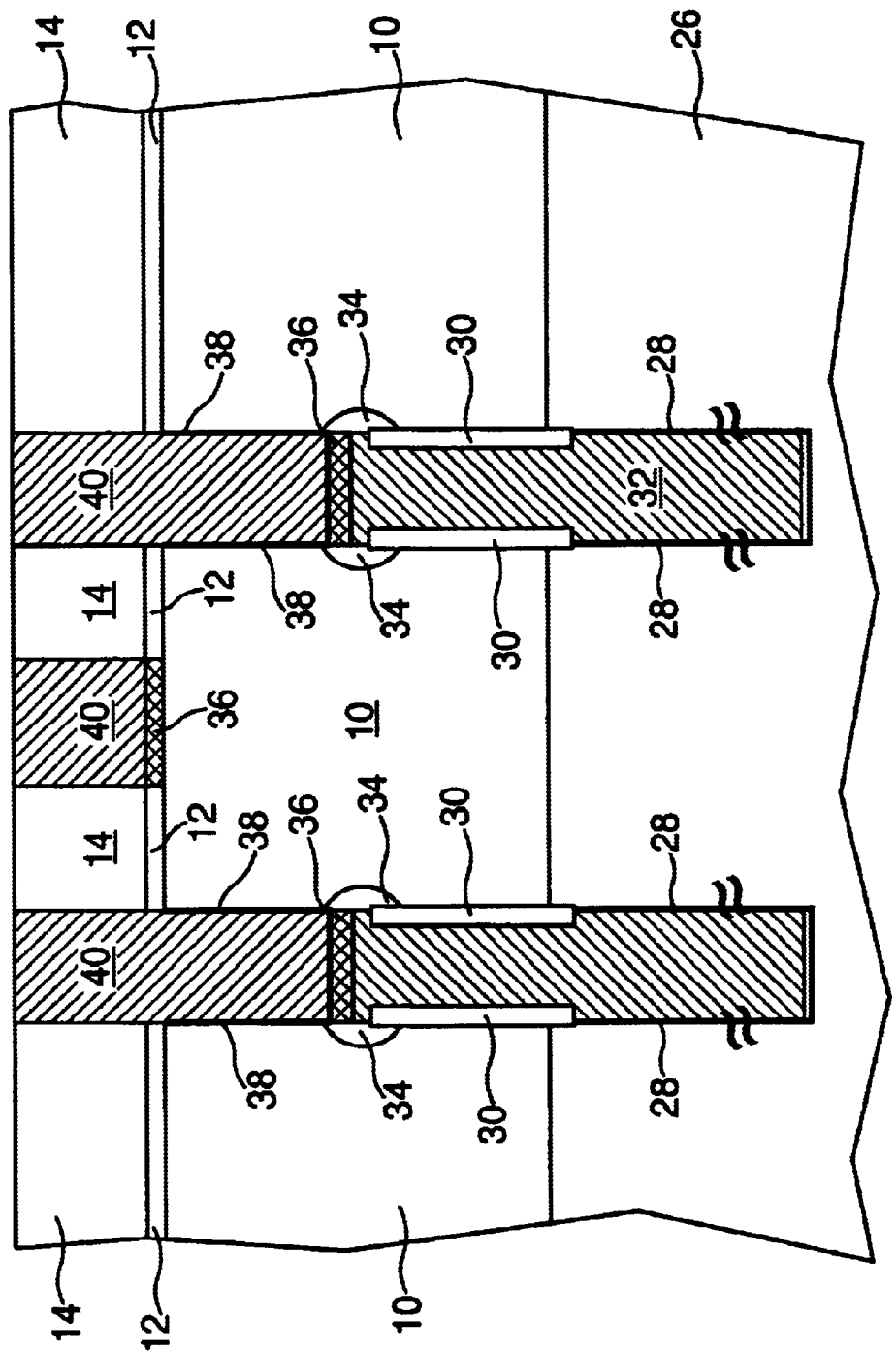
Figure 8C:
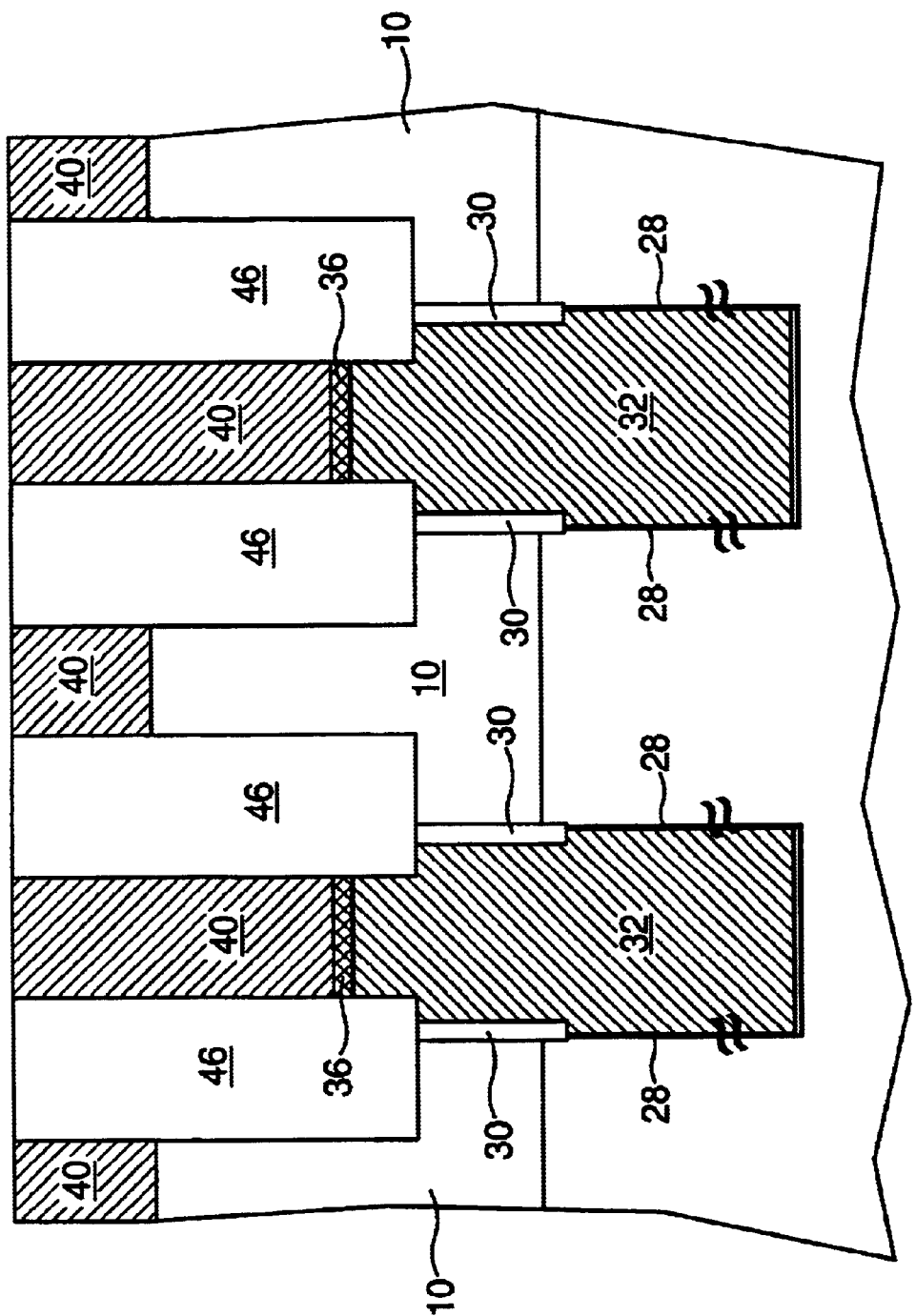
Figure 8D:
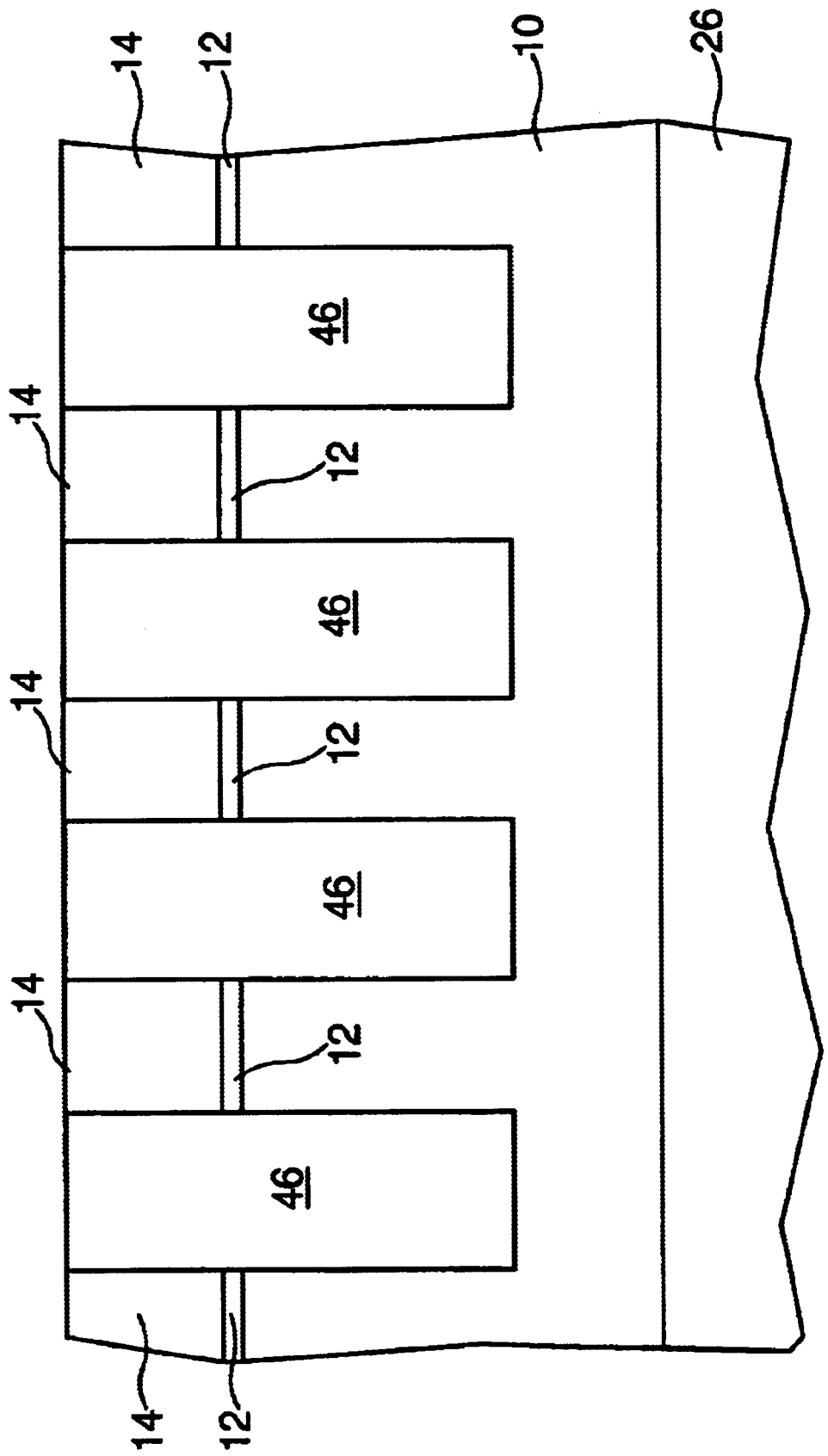

With active area resist stripes 42 in place, the exposed portions of pad nitride layer 14, underlying pad oxide 12 and a portion of the Si-containing substrate 10 are etched using a conventional etching process such as RIE so as to form isolation trenches in the structure. The isolation trenches are then filled with an isolation oxide material such as CVD oxide or HPD oxide and thereafter planarized to the top surface of the remaining pad nitride 14 so as to form isolation regions 46 in the structure. In some embodiments, the isolation trenches are lined with a liner material prior to deposition of the isolation oxide material and a densification-processing step may be performed after deposition of the isolation oxide material. The resultant structure formed after the above processing steps have been carried out is shown, for example, in FIGS. 8A (top view), 8B (cut through A—A), 8C (cut through B—B), and 8D (cut through C—C). Note that the planarization process may also remove some of the exposed portions of the heavily doped polysilicon.

Following planarization of the isolation oxide material, the remaining nitride pad 14 is stripped selective to oxide and silicon utilizing conventional etching processes well known in the art. Array well implants (not specifically shown) and bitline diffusion implants are then performed into the opening provided by the removal of the nitride pad. Note the bitline diffusion implant forms bitline diffusion regions 48 in the top surface of Si-containing substrate 10, See FIG. 9. The biltine diffusion regions are formed adjacent to each trench storage memory cell. A soft insulating material 50 such as BPSG (boron doped phosphorus silicate glass) is then deposited using a conventional deposition process filling the opening between the polysilicon in the active area stripes, and thereafter a conventional planarization process is performed so as to form a planar structure.

Figure 9:
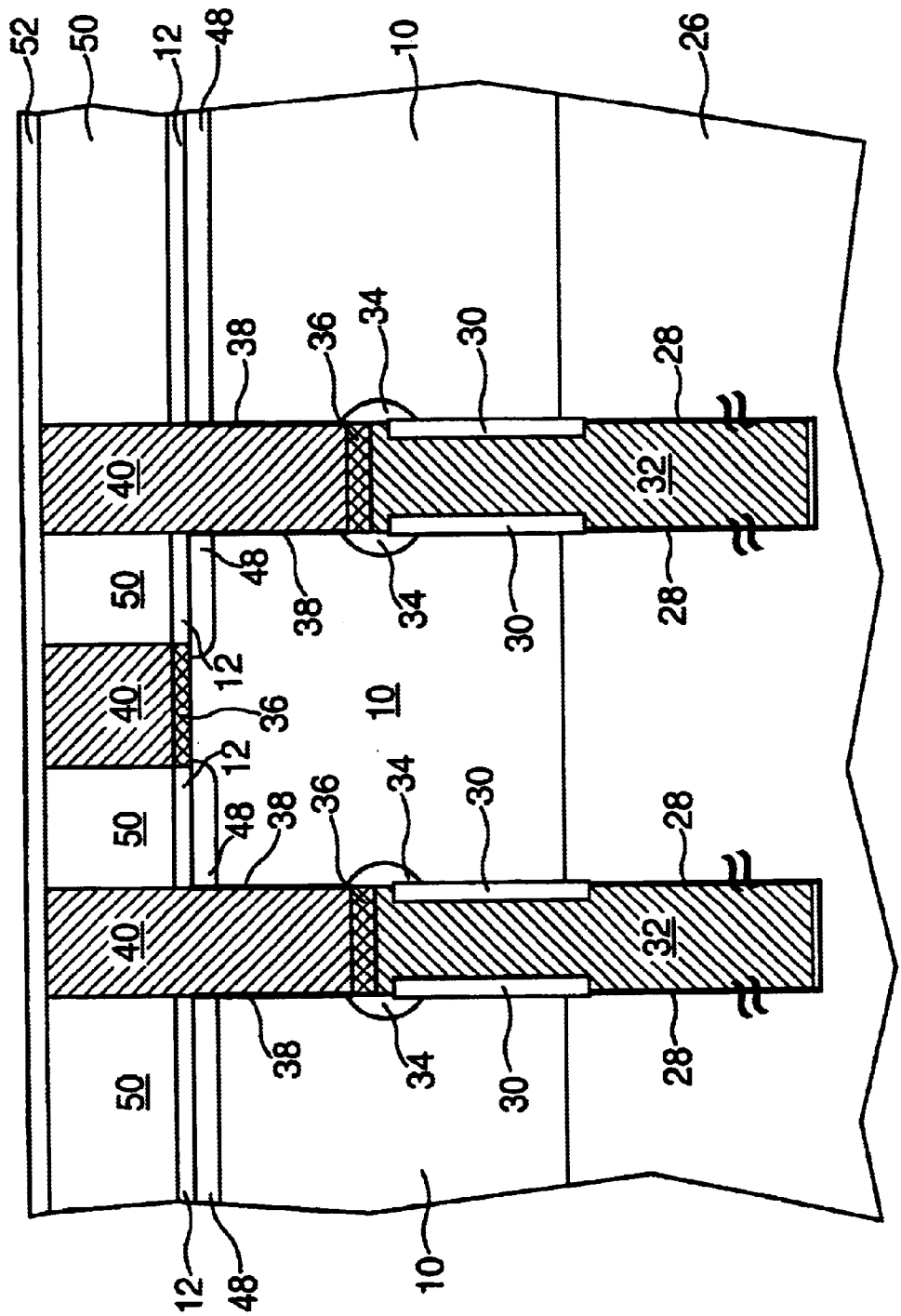

A protective nitride layer 52 is then formed using a conventional deposition process, and thereafter a block mask (not shown) is formed over the array region shown in FIG. 9. The protective nitride layer is removed from the support regions (not shown) to allow further processing in that region. Specifically, with the array protected by block masks, support well implants are performed. Then after removing any block mask, gate oxidation, gate conductor and source/drain implants are done by conventional methods.

After the support regions have been processed, the protective nitride layer 52, is removed from the array region. Next, heavily doped N+ polysilicon layer 40 is recessed to a depth that is shallower than the top portion of the bitline diffusion regions. In a preferred embodiment of the present invention, the heavily doped N+ polysilicon is recessed to a depth so as to remove all polysilicon from atop the TTO on the surface of the substrate.

Figure 10:
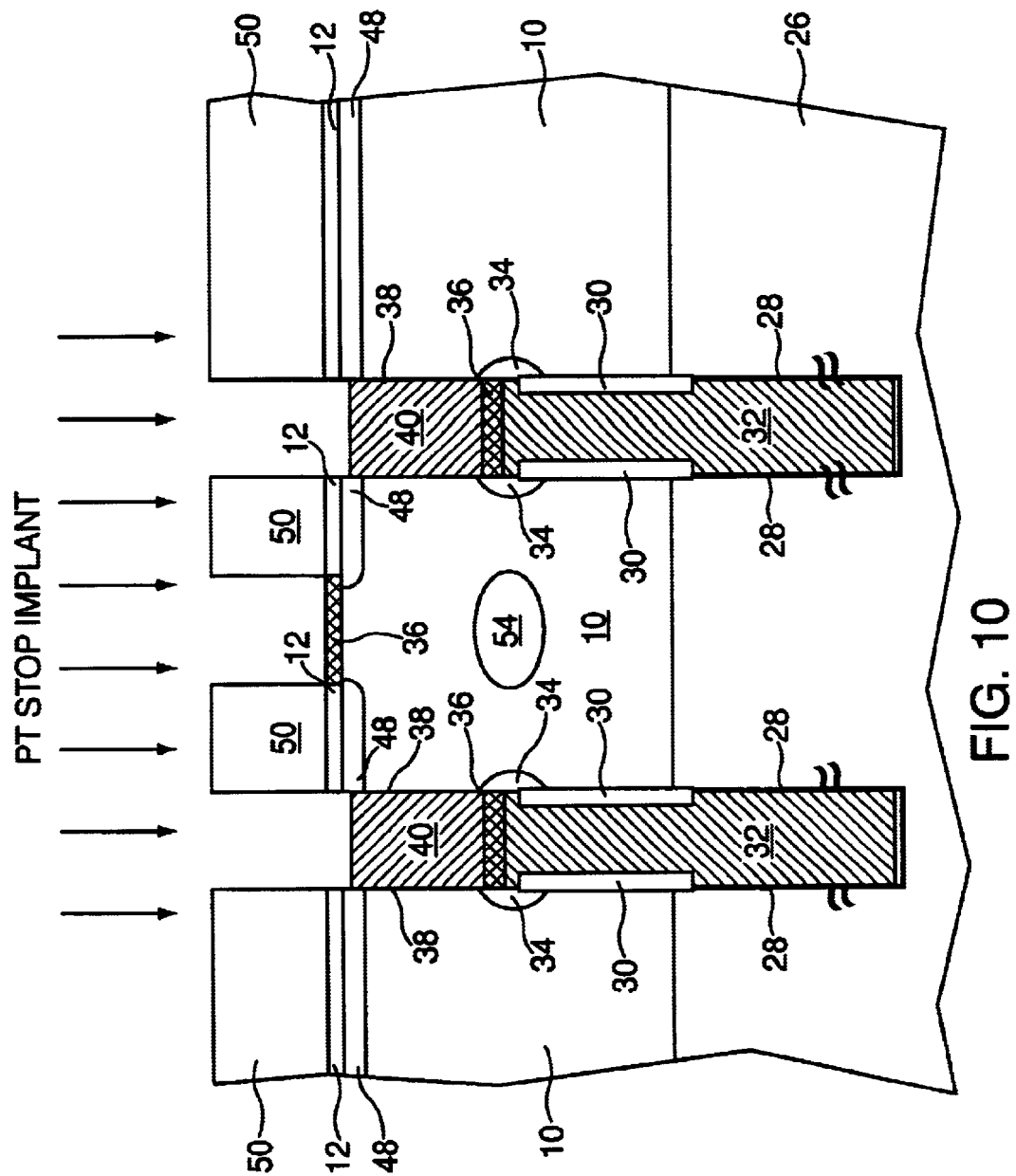

At this point, punchthrough stop doping pockets 54 are formed using either a P or N type implant. When a P-type implant is performed, boron or indium may be used as the dopant species. It is noted that the dopant concentration of pockets 54 is substantially less than the heavily doped N+ polysilicon layer such that the concentration of the heavily doped N+ polysilicon is not affected. For example, when a P type implant is performed the punchthrough stop doping pockets have a doping concentration on the order of about $1E18$ cm$^{-1}$ or less. The resultant structure formed during these steps of the present invention is shown in FIG. 10. Note that in FIG. 10, PT STOP IMPLANT denotes the punchthrough stop doping implant and that pocket region 54 is self-aligned to the adjacent deep trenches.

Figure 11:
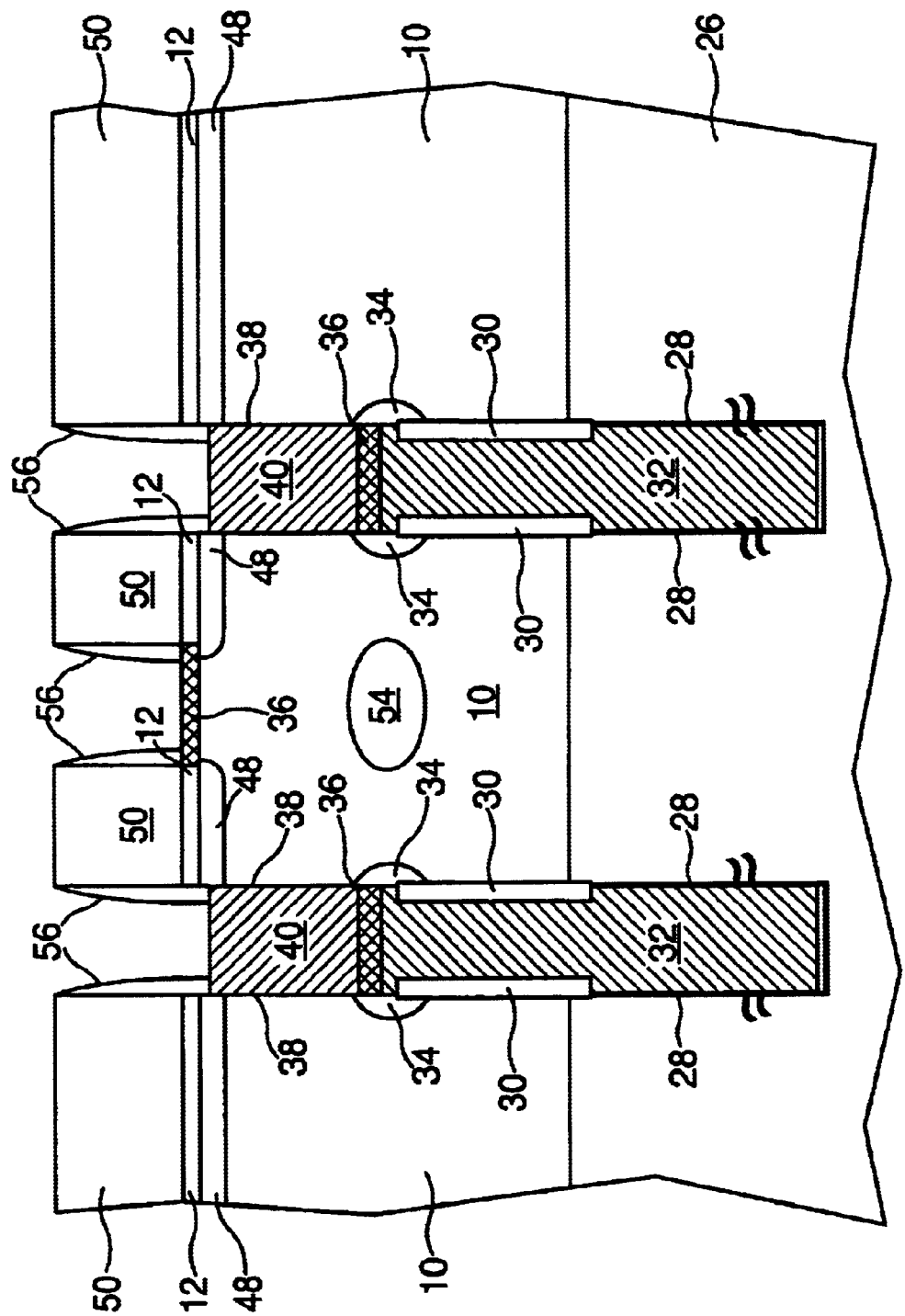

Following the formation of the punchthrough stop doping pockets, nitride spacers 56 are formed on the exposed sidewalls in the opening using deposition and etching processes well known to those skilled in the art so as to form the structure shown in FIG. 11. It is noted that in some embodiments of the present invention, the formation of punchthrough stop doping pockets 54 may be delayed until after nitride spacers 56 have been formed. This optional embodiment of the present invention provides narrower punchthrough stop doping pockets which avoids encroaching upon the strap outdiffusions as groundrules are aggressively scaled.

Figure 12:
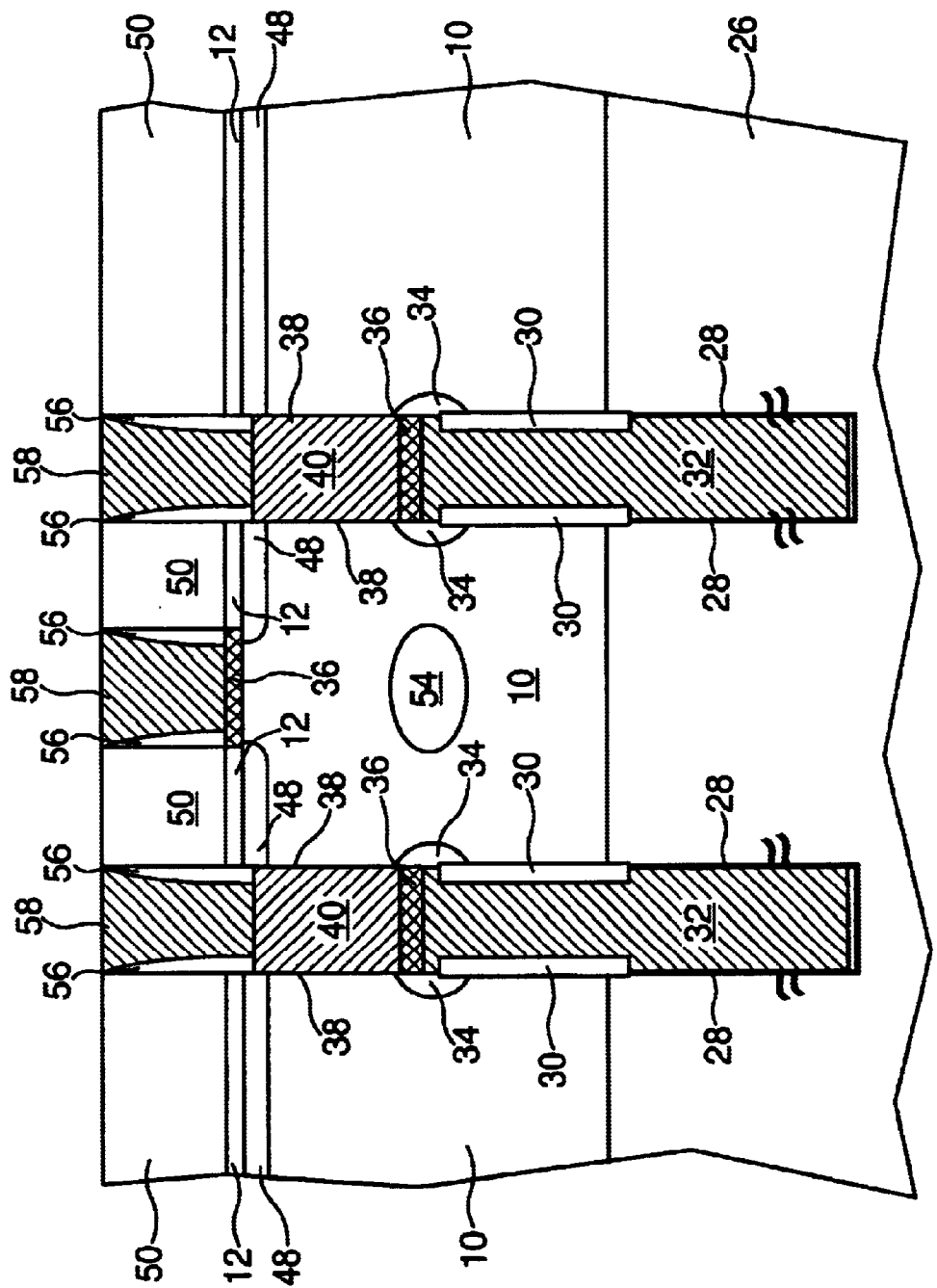

FIG. 12 shows the structure that is formed after conductive plug 58 is formed in the openings including nitride spacers 56. The conductive plug may include doped polysilicon, tungsten, aluminum, copper, platinum and other like conductive materials. The conductive plug is formed utilizing a conventional deposition process and planarization. Conductive plugs 58 are employed in the present invention to connect the wordlines to the gate conductor polysilicon (i.e., layer 40) of the vertical transistor.

Optionally, conductive plugs which do not overlie a gate conductor 40 may be selectively removed using a mask. The opening from which the conductive plugs were removed may now be filled with CVD oxide and planarized. This optional process embodiment reduces the capacitance between the subsequently formed wordlines and bitlines, at the cost of increased process complexity.

Figure 13:
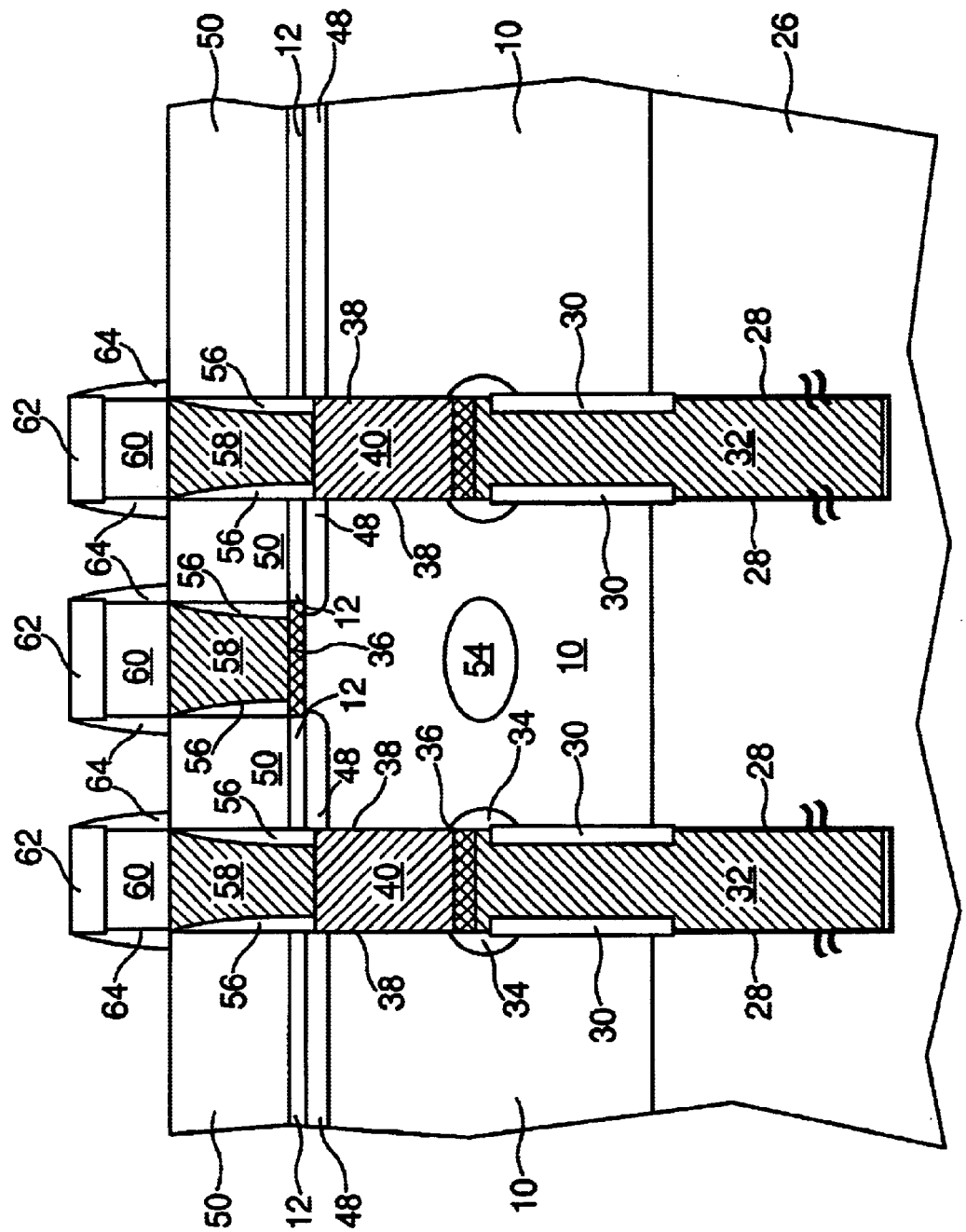
Figure 14:
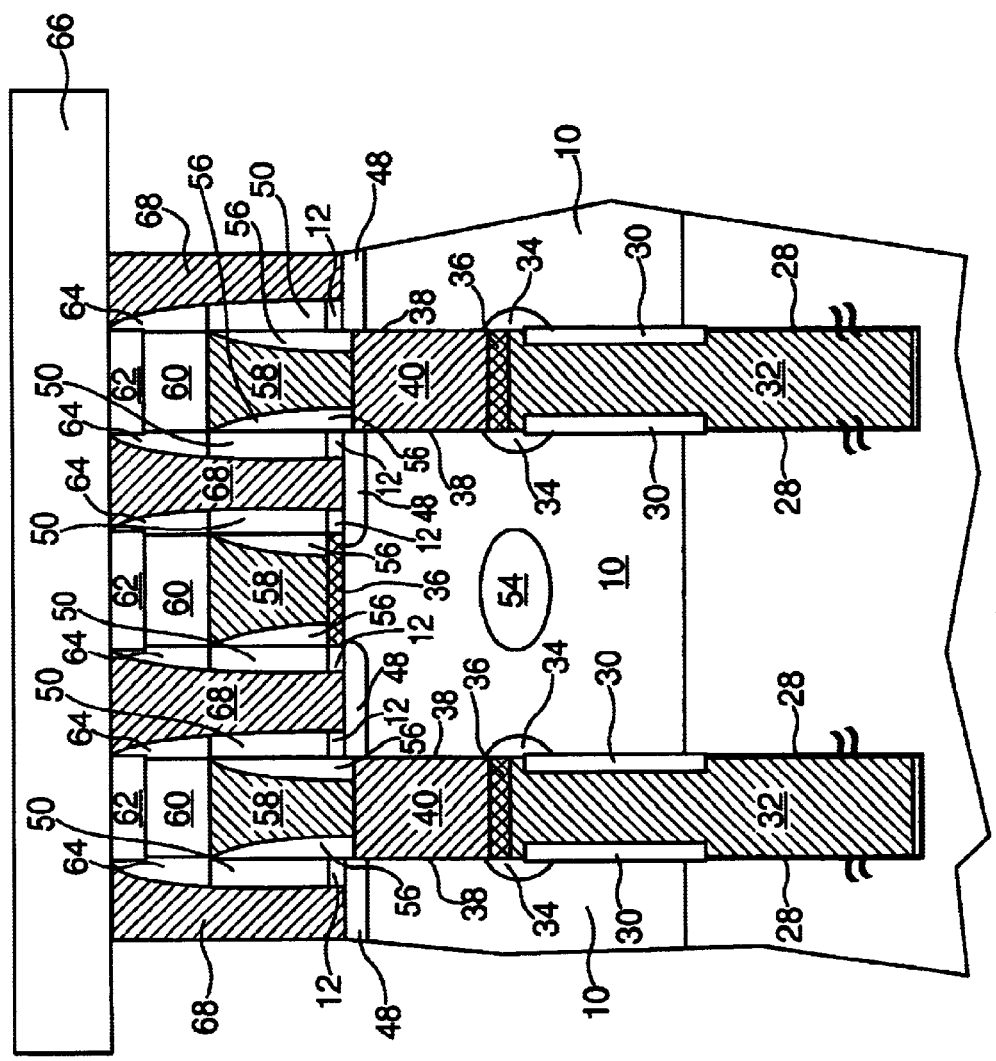

Next, and as shown in FIG. 13, wordlines that include conductive material 60, nitride cap 62 and nitride spacers 64 are formed using techniques that are well known to those skilled in the art including deposition and etching. The nitride spacers are formed on the sidewalls of the wordlines providing protection against wordline to bitline shorting during subsequent formation of bitline conductors 66 which are shown in FIG. 14.

Specifically, the bitline conductors are formed by first removing soft insulating material 50 and underlying pad oxide layer 12 from the structure using a conventional RIE process, stopping atop the surface of the Si-containing substrate which includes the bitline diffusions. Doped polysilicon or other conductive plug material 68 is then deposited and planarized to the top of nitride cap 62. A bitline conductive metal such as tungsten is then deposited and etched to form bitline conductors 66. Standard processing continues through formation of additional wiring levels, vias and interlevel dielectrics.

While the present invention has been particularly shown and described with respect to preferred embodiments thereof, it will be understood by those skilled in the art that the foregoing and other changes in form and detail may be made without departing from the scope and spirit of the present invention. It is therefore intended that the present invention not be limited to the exact forms and details described and illustrated, but fall within the spirit and scope of the appended claims.

Having thus described our invention in detail, what we claim as new and desire to secure by the Letters Patent is:

1. A semiconductor memory structure comprising:

at least one adjacent pair of trench storage memory cells present in a Si-containing substrate, each memory cell including a vertical transistor overlaying a trench capacitor;

strap outdiffusions present on each vertical sidewall of the trench storage memory cells, wherein said strap outdiffusions interconnect said vertical transistor and said trench capacitor of each memory cell to said Si-containing substrate;

a punchthrough stop doping pocket located between each adjacent pair of trench storage memory cells, said punchthrough stop doping pocket is centered between said strap outdiffusions;

wordlines present atop each trench storage memory cell; and bitline conductors located atop said wordlines, said bitline conductors and said wordlines are isolated from each other.

2. The semiconductor memory structure of claim 1 wherein a plurality of adjacently paired trench storage memory cells are employed, and said punchthrough stop doping pockets are positioned at substantially the same location within the Si-containing substrate thereby eliminating alignment tolerance in the structure.

3. The semiconductor memory structure of claim 1 wherein said trench capacitor comprises a buried plate diffusion region present about a storage trench, a node dielectric lining said storage trench and a N+ polysilicon layer present on said node dielectric.

4. The semiconductor memory structure of claim 1 wherein said vertical transistor comprises a gate dielectric present on sidewalls of a storage trench and a N+ doped polysilicon gate conductor present on said gate dielectric.

5. The semiconductor memory structure of claim 1 wherein said vertical transistor and said trench capacitor are separated by a trench top oxide layer.

6. The semiconductor memory structure of claim 1 wherein said punchthrough doping pocket includes a P-type dopant.

7. The semiconductor memory structure of claim 6 wherein said punchthrough doping pocket has a dopant concentration of about $1E18$ atoms/cm$^3$ or less.

8. The semiconductor memory structure of claim 1 wherein said wordlines are in contact with said vertical transistors by means of a conductive plug.

9. The semiconductor memory structure of claim 1 wherein said wordlines include a conductive material, a nitride cap present atop said conductive material and nitride sidewall spacers present on exposed sidewalls of said conductive material and said nitride cap.

* * * * *